United States Patent [19]

Takahashi et al.

[11] Patent Number: 4,933,628

[45] Date of Patent: Jun. 12, 1990

[54] VOLTAGE DETECTING DEVICE

[75] Inventors: Hironori Takahashi; Yutaka Tsuchiya, both of Shizuoka, Japan

[73] Assignee: Hamamatsu Photonics K.K., Shizuoka, Japan

[21] Appl. No.: 201,173

[22] Filed: Jun. 2, 1988

[30] Foreign Application Priority Data

Jun. 10, 1987 [JP] Japan .................................. 62-144983

[51] Int. Cl.$^5$ .......................... G01R 15/07; H01P 3/08
[52] U.S. Cl. ...................................... 324/96; 333/238; 350/356
[58] Field of Search .................. 324/96, 117 R, 158 R; 350/356, 374, 376; 333/238

[56] References Cited

U.S. PATENT DOCUMENTS

| 3,633,996 | 1/1972 | Lean et al. | 350/358 |
|---|---|---|---|
| 4,242,635 | 12/1980 | Burns | 324/158 R |
| 4,355,278 | 10/1982 | Burns et al. | 324/158 R |
| 4,446,425 | 5/1984 | Valdmanis et al. | |
| 4,640,626 | 2/1987 | Schmid et al. | 324/73 R |

FOREIGN PATENT DOCUMENTS

| 0021123 | 1/1987 | Japan | 350/356 |
|---|---|---|---|
| 0010410 | 3/1987 | Japan | 350/356 |

OTHER PUBLICATIONS

Picosecond Electro-Optic Sampling System: by J. A. Valdmanis, G. Mourou, and C. W. Gabel (Appl. Phys. Lett., 41(3), 1 Aug. 1982).
Subpicosecond Electrical Sampling: by J. A. Valdmanis, Gerard A. Mourou and C. W. Gabel (IEEE Journal of QE., vol. QE-19, No. 4; Apr. 1983).
Electro-Optic Sampling with Picosecond Resolution: by B. H. Kolner, D. M. Bloom and P. S. Cross (Electronics Letters, 21st Jul. 1983, vol. 19, No. 15).
Subpicosecond Electrical Sampling and Applications: by J. A. Valdmanis and G. Mourrou (1984).
Advances in Streak Camera Instrumentation for the Study of Biological and Physical Processes: by Yutaka Tsuchiya (IEEE Journal of Q.E., vol. QE-20, No. 12, Dec. 1984).
Picosecond Electo-Electron Optic Oscilloscope: by S. Williamson and G. A. Mourou (Proc. Conf. Picosecond Electron Optoelectron, 1985).
Electrooptic Sampling in GaAs Integrated Circuits: by Brian H. Kolner and David M. Bloom (IEEE Journal of Q.E., vol. QE-22, No. 1, Jan. 1986).
Subpicosecond Electrooptic Sampling: Principles and Applications: by Janis A. Valdmanis and G. Mourou (IEEE Journal of Quantum Electronics, vol. QE-22, No. 1, Jan. 1986).
Electro-Optic Sampling: Testing Picosecond Electronics Part 1, Principles and Embodiments: by J. A. Valdmanis and G. Mourou (Laser Focus/Electro-Optic, Feb. 1986).
Electro-Optic Sampling: Testing Picosecond Electronics Part 2, Applications: by J. A. Valdmanis and G. Mourou (Laser Focus/Electro-Optics, Mar. 1986).
Noncontact Electro-Optic Sampling with a GaAs Injection Laser: by J. Nees and G. A. Mourou (Electronics Letters, 14th Aug. 1986, vol. 22, No. 17).
High-Speed Optical Electronics: The Picosecond Optical Oscilloscope: by J. A. Valdmanis (S40 Solid State Technology, Test & Measurement World, Nov. 1986).

Primary Examiner—Ernest F. Karlsen
Attorney, Agent, or Firm—Finnegan, Henderson, Farabow, Garrett and Dunner

[57] ABSTRACT

There is provided a voltage detecting device using an electro-optical material which has its refractive index changed by a voltage provided on an object under test. The voltage detecting device consists of a strip line formed on the upper surface of the electro-optical material and an electrode formed on the bottom surface of the electro-optical material. One or both of the strip line and electrode may be formed of transparent conductive materials. In operation, a light beam is passed either from the top or the bottom of the device through the electro-optical material and the change in the polarization of the light is measured. That change is related to the voltage level of the voltage signal passing through the strip line formed on the material.

7 Claims, 3 Drawing Sheets

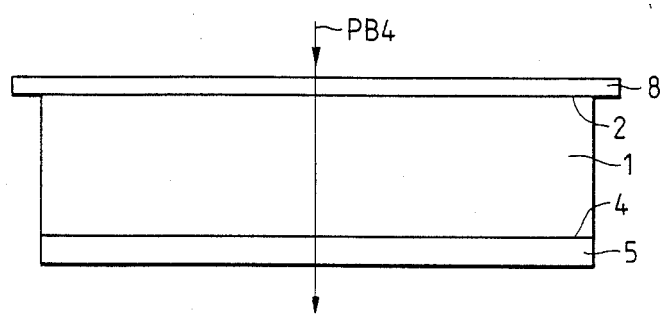
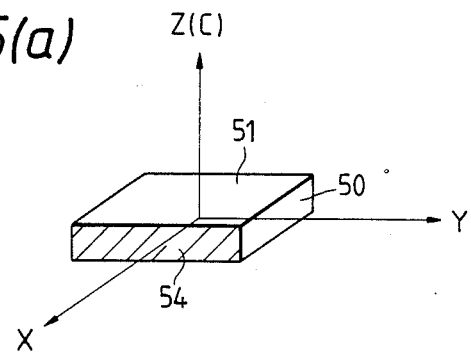
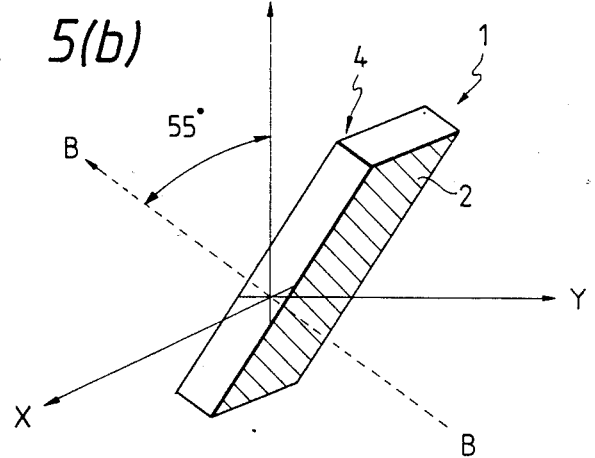

VOLTAGE DETECTING DEVICE

BACKGROUND OF THE INVENTION

1. Field of the Invention

This invention relates to a voltage detecting device for detecting a voltage provided at a predetermined part of an object under measurement, and more particularly to a voltage detecting device utilizing the principle that the polarization of light passing through electro-optical material is changed by a voltage provided to that material

2. Background Information

A voltage detecting device for detecting, in a time resolution of sub-pico seconds, the voltage of an ultra-high-speed photo detector, semiconductor switch or high-speed electronic device is well known in the art.

In FIG. 6(a) is shown a perspective view of a voltage detecting device of the above-described type, which was disclosed by Janis A. Valdmanis et al, "IEEE Journal of Quantum Electronics," Vol. QE-19, No. 4, pp. 664–667 (published in Apr. 1983). Shown in FIG. 6(b) and FIG. 6(c) are a top view and a front view of the voltage detecting device shown in FIG. 6(a).

In the voltage detecting device as shown in FIG. 6(a), an electro-optical material 50 of lithium tantalate (LiTaO$_3$) is cut perpendicular to the C-axis, an aluminum strip line 52 is provided on a surface 51 of the electro-optical material 50 which is perpendicular to the C-axis, and a predetermined part of an object 53 under test is connected to the strip line 52.

When the object 53 under test is an ultra-high-speed photo detector, for example, with a predetermined part of the photo detector connected to the strip line 52, a voltage pulse VP having a pulse width of the order of ten pico seconds outputted from photodetector 53 moves along the strip line 52 at a speed $V_O$ as shown in FIG. 6(c). As a result, an electric field E is applied to that part of the electro-optical material 50 which is just below the strip line 52 along which the voltage pulse VP moves. The refractive index of that part of material 50 is changed as a result of the electric field. Accordingly, referring to FIG. 6(b), when a linearly polarized light beam PB is applied to one side 54 of the electro-optical material 50 in such a manner that it forms an angle $\theta$ with the longitudinal axis A—A of the strip line 52, the speed component, $V \cos \theta$, of the light beam PB taken along the axis A—A is equal to the speed $V_O$ of the voltage pulse VP. Thus, the light beam PB passes through the electro-optical material 50 following the refractive index change caused by the voltage pulse VP. The polarization of the light beam will be changed by the well known Pockels effect as it passes through material 50. The light beam will be outputted, as a transmitted light beam, from the opposite side 55 of the electro-optical material 50. If the change in polarization of the transmitted light beam can be detected, then the value of the voltage pulse VP moving along the strip 52 can be achieved without affecting the object under test.

In the voltage detecting device shown in FIG. 6(a), the light beam PB is applied to the electro-optical material 50 in such a manner that its speed component along the longitudinal axis of the strip line 52 is equal to the speed $V_O$ of the voltage pulse VP; that is, the light beam PB and the voltage pulse are allowed to interact with each other, so that the voltage is detected from the change in polarization of the light beam PB. In the voltage detecting device, as described above, the light beam PB is allowed to enter the electro-optical material 50 through one side 54 and to emerge from the opposite side 55. Therefore the optical beam PB and the voltage pulse interact with each other for the period of time T, which represents the time the light beam PB spends crossing the strip line 52. This relationship is given by the following formula:

$$T = W/(V \sin \theta) \quad (1)$$

where W is the width of the strip line 52, and V is the speed of the light beam PB in the electro-optical material 50.

If the voltage pulse VP is of the order of several kilovolts (kV), the polarization of light beam PB will change to the extent that it can be detected, even if the period of time T is short. However, if the voltage pulse VP is lower than several kilo-volts, then it is necessary to increase the period of time T in order to detect the polarization of the light beam PB. Since the period of time T depends on the width W of the strip line 52, as is apparent from the above equation (1), the ability to design the voltage detecting device shown in FIGS. 6(a) and (b) to increase the period of time T, and to change the polarization of the light beam PB as required, is limited to the practical width W of strip line 52.

Accordingly, an object of this invention is to provide a voltage detecting device which can change the polarization of a light beam in an electro-optical material to the extent that it can be detected, to detect the voltage value of the voltage pulse with high accuracy.

SUMMARY OF THE INVENTION

To achieve the foregoing and other objects, and in accordance with the purpose of the invention as embodied and broadly described herein, there is provided a voltage detecting device which comprises: a strip line formed on the upper surface of an electro-optical material for allowing a voltage provided at a predetermined part of an object under test to advance as a progressive wave and an electrode provided on the lower surface of the electro-optical material.

According to a first aspect of the invention, the strip line and/or electrode may be made of transparent conductive material so that a linearly polarized light beam is allowed to enter the electro-optical material and to emerge, as a reflected light beam or transmitted light beam, from the electro-optical material.

According to a second aspect of the invention, the electro-optical material is cut so that the change in polarization of the light beam is maximized.

In the present invention, the voltage at the predetermined part of the object under test is allowed to advance, as a progressive wave, along the strip line formed on the upper surface of the electro-optical material. As the voltage advances in this manner, the refractive index of the part of the electro-optical material which is just below the strip line is changed. At the same time a linearly polarized light beam is applied to the lower surface of the electro-optical material through the electrode made of transparent conductive material so that it advances in the electro-optical material in synchronization with the advance of the voltage; that is, the speed of change of the refractive index. The polarization of the light beam changes with the refractive index. The light beam, being reflected by the strip line which is, for instance, made of metal, is allowed to emerge as a reflected light beam from the electro-optical material through the transparent electrode. Thus, the polarization of the light beam is changed while the light beam advances from the lower surface of the electro-optical material to the strip line and for the period of time which elapses from the time the light beam is reflected by the strip line until the light beam emerges from the lower surface of the electro-optical material. In order to increase the polarization change, a part of the electrode may be made of reflecting conductive material so that the light beam is reflected several times in the electro-optical material.

Also, in the present invention, the electro-optical material is cut so that the change in polarization of the light beam is maximized by the voltage at the predetermined part of the object under test; more specifically, the upper and lower surfaces thereof are perpendicular to the axis which forms 55° with the C-axis of the crystal. This will act to be maximize the change in the polarization of the light beam.

BRIEF DESCRIPTION OF THE DRAWINGS

FIG. 4 is a cross-sectional diagram showing a fourth embodiment of the invention;

FIG. 5(a) illustrates a method of cutting an electro-optical material in which the upper surface and the lower surface are perpendicular to the C-axis;

FIG. 5(b) illustrates a method of cutting an electro-optical material in which the change in polarization of a light beam therein is maximized;

DESCRIPTION OF THE PREFERRED EMBODIMENTS

Figure 1:
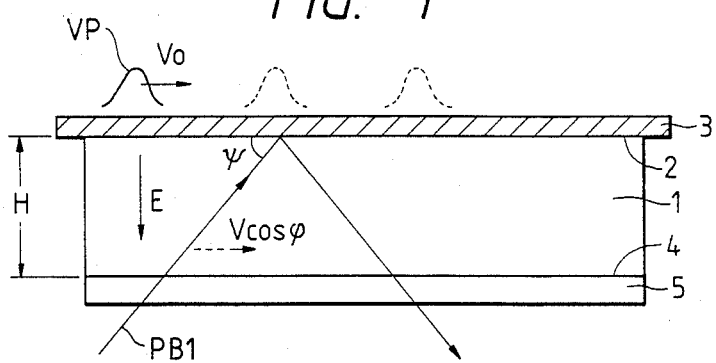
FIG. 1 is a cross-sectional diagram illustraing a portion of a voltage detecting device according to the present invention.

FIG. 1 is a sectional view outlining a first preferred embodiment of a voltage detecting device according to the present invention. In the voltage detecting device of FIG. 1, an aluminum or gold strip line 3 is provided on the upper surface 2 of an electro-optical material 1 of lithium tantalate (LiTaO$_3$) or lithium niobate (LiNbO$_3$), and a transparent electrode 5 is formed on the bottom surface 4 of the electro-optical material 1. The transparent electrode 5 is held, for instance, at ground potential.

Figure 6A:
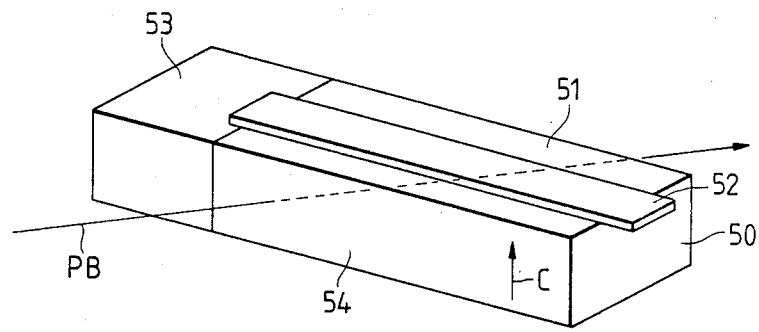
FIG. 6(a) illustrates a conventional voltage detecting device.

In the voltage detecting device of FIG. 1, as in the above-described conventional voltage detecting device shown in FIG. 6(a), a predetermined part of an object under test, for instance a photo detector, is connected to the strip line 3, and a voltage pulse VP is allowed to move, as a progressive wave, along the strip line 3 at a speed $V_O$. As a result, an electric field E is applied to that part of the electro-optical material 50 which is just below the strip line 52, and the refractive index of that part is changed. That is, the refractive index change advances at the speed $V_O$ following the movement of the voltage pulse VP.

In the voltage detecting device of FIG. 1, unlike the conventional voltage detecting device in which light beam PB is applied to the side of the electro-optical material 1, the light beam PB1 is applied through the transparent electrode 5 and the bottom 4 of the electro-optical material 1 to the part of the electro-optical material 1 just below the strip line 3. In this operation, the incident angle $\tau$ is so selected that the speed component $V \cos \psi$ of the light beam in the electro-optical material 1, taken along the longitudinal axis of the strip line 3, is equal to the speed $V_O$ of the voltage pulse VP. Therefore, the light beam PB1 incident on the bottom 4 of the electro-optical material 1 reaches the upper surface 2 while being affected by the refractive index change of the electro-optical material 1, and is then reflected by the strip line 2 through the bottom surface 4 and the transparent electrode 5. While the light beam PB1 advances from the bottom surface 4 of the electro-optical material 1 to the top surface 2, and for the period of time that elapses from the time the light beam is reflected by the strip line 3 until the light beam emerges from the bottom surface 4 of the electro-optical material 1, the polarization of the light beam PB1 changes with the refractive index. The period of time $T_1$ for which the polarization of the light beam PB1 changes is:

$$T_1 = 2H/(V \sin \psi) \tag{2}$$

Figure 6B:
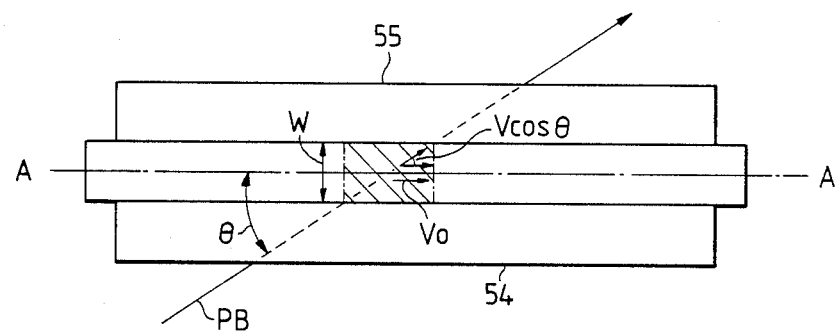
FIG. 6(b) illustrates a light beam passing through the device of FIG. 6(a)
Figure 6C:
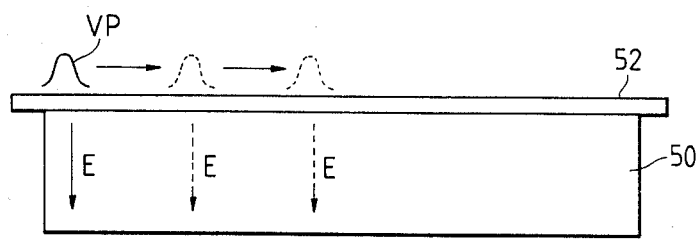
FIG. 6(c) illustrates a voltage pulse traveling across the device of FIG. 6(a).

When the width W of the strip line in equation (1) is equal to the thickness H of the electro-optical material in equation (2) and the angle $\theta$ in equation (1) is equal to the angle $\psi$ in equation (2), the polarization change in the voltage detecting device of FIG. 1 is two times larger than that in the conventional voltage detecting device of FIG. 6. In this case, even if the voltage level of the voltage pulse VP is not high, the polarization of the light beam PB1 changes to the extent that it can be detected, and therefore the voltage level of the voltage pulse can be detected with high accuracy.

Figure 2:
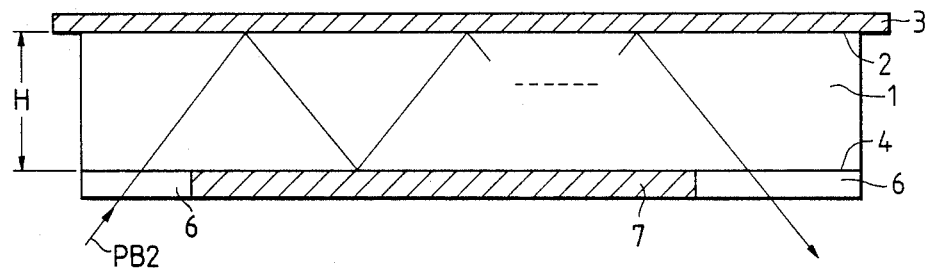
FIG. 2 is a cross-sectional diagram showing a second embodiment of the present invention.
Figure 3:
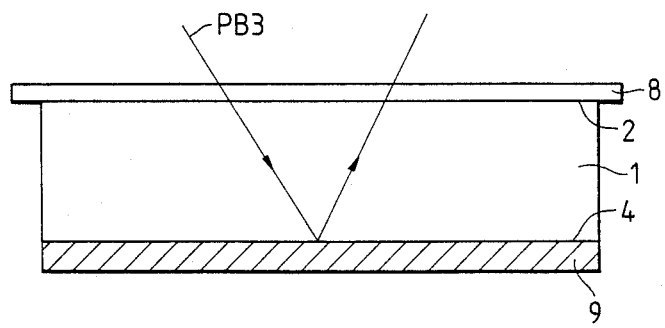
FIG. 3 is a cross-sectional diagram showing a third embodiment of the present invention.

FIGS. 2, 3 and 4 are diagrams showing modifications of the voltage detecting device of FIG. 1. In FIGS. 2 through 4, parts corresponding functionally to those which have been described with reference to FIG. 1 are designated by the same reference numerals or characters.

In a voltage detecting device of FIG. 2, transparent electrodes 6 are formed on a part of the bottom surface 4 of the electro-optical material 1 to which a linearly polarized light beam PB2 is applied, and on a part of the bottom surface from which the reflected light beam emerges, respectively; and a reflecting mirror 7, for instance of metal, is formed on the remaining part, which is used for reflecting the light beam PB2 into the electro-optical material 1 n times.

In the voltage detecting device thus constructed, the light beam PB2 entering the electro-optical material 1 through one of the transparent electrodes 6 is reflected n times between the strip line 3 and the reflecting mirror 7, and is then allowed to emerge, as a reflected light beam, from the other transparent electrode 6. In this operation, the period of time $T_2$ for which the polarization of the light beam PB2 changes is:

$$T_2 = (n+1) H/(V \sin \psi) \tag{3}$$

That is, the polarization change in the reflected light beam can be increased, and therefore even if the voltage level of the voltage pulse VP is small, the voltage level can be detected with high accuracy.

In the voltage detecting device shown in FIG. 3, a transparent strip line 8 is formed on the top surface of the electro-optical material 1, and a reflecting mirror 9, for instance of metal, is formed on the bottom surface 4 of the electro-optical material 1. In the voltage detecting device thus constructed, as opposed to the voltage detecting device of FIG. 1, a linearly polarized light beam PB3 is allowed to enter the electro-optical material 1 through the transparent strip line 8 and the top surface 2, and is reflected by the reflecting mirror 9, so that it emerges, as a reflected light beam, from the strip line 8. If it is desired to reflect the light beam PB3 several times in the electro-optical material 1, as in the case of FIG. 2, the strip line 8 may be so modified so that both end portions thereof are made of a transparent conductor and the remaining portion is made of a metal conductor such as aluminum.

In the voltage detecting device of FIG. 4, a transparent strip line 8 is formed on the top surface 2 of the electro-optical material 1, and a transparent electrode 5 is formed on the bottom surface 4 of the electro-optical material 1. In the voltage detecting device thus constructed, a linearly polarized light beam PB4 is allowed to enter the electro-optical material 1 through the transparent strip line 8, and to emerge, as a transmitted light beam, from the transparent electrode 5.

The use of the transparent conductive material allows the light beam to enter the electro-optical material in a desired incidence pattern, thus greatly increasing the degree of freedom in choosing the incident angle of the light beam.

In FIG. 5(a), a conventional method of cutting the electro-optical material is shown. In the conventional voltage detecting device shown in FIG. 6(a), the electro-optical material 50 is so cut that the upper surface 51 and the lower surface thereof are perpendicular to the C-axis. It has been confirmed that electro-optical material 50 cut in the above-described manner shows high electro-optical constants; however, when the voltage of a pulse is detected from the change in polarization of a light beam applied to the electro-optical material through side 54, the cut as shown in FIG. 5(a) is not optimal; that is, the half-wave voltage appears higher.

In FIG. 5(b) a diagram for a method of cutting an electro-optical material which maximizes the change in polarization of a light beam therein is shown. As shown in FIG. 5(b), the electro-optical material of lithium tantalate (LtTaO$_3$) or lithium niobate (LiNbO$_3$) is cut so that the upper surface 2 and the lower surface 4 thereof are perpendicular to the diagonal line B—B of the crystal which forms an angle of 55° with the C-axis. When electro-optical material 1 cut in this manner is used as shown in FIG. 2, 3 or 4, the polarization change is greater than that where the electro-optical material is cut as described above with reference to FIG. 5(a), i.e., where the upper surface 51 and the lower surface are perpendicular to the C-axis. In addition, the half-wave voltage in the material cut as shown in FIG. 5(b) is about one-third of that in the material cut as shown in FIG. 5(a). Thus, the voltage generated by the predetermined part of the object under test can be detected with higher accuracy and with higher sensitivity.

In the embodiments of the invention illustrated in FIGS. 1 through 5, the parts of the device which are not concerned with the incidence, reflection and transmission of the light beam may be painted black for prevention of light scatter.

As is apparent from the above description, according to the first aspect of the invention, the strip line and/or the electrode are made of transparent conductive material. Therefore, when a light beam is allowed to enter the electro-optical material through the upper surface or the lower surface thereof, the change in the polarization of the light beam in the electro-optical material can be increased, and therefore the voltage of the predetermined part of the object under test can be detected with high accuracy. Furthermore, according to the second aspect of the invention, the electro-optical material is cut so that the change in polarization of the light beam is maximized by the voltage generated by the predetermined part of the object under test, and therefore the voltage can be detected with higher sensitivity.

It should be apparent to those skilled in the art that various modifications may be made to the subject matter of the present invention without departing from the scope or spirit thereof. Thus, it is intended that the invention cover modifications and variations of the invention, provided they come within the scope of the appended claims and their legally entitled equivalents.

What is claimed is:

1. A voltage detecting device using an electro-optical material whose refractive index is changed by a voltage provided by a predetermined part of an object under measurement, the device comprising:

a strip line having a longitudinal axis and formed on the upper surface of said electro-optical material for allowing a pulse of said voltage to advance as a progressive wave at a predetermined speed; and an electrode provided on the lower surface of said electro-optical material;

wherein at least one of said strip line and said electrode made of transparent conductive material so that a linearly polarized light beam is allowed to enter said electro-optical material through said transparent one of said strip line and electrode and to emerge from said electro-optical material through said transparent one of said strip line and electrode; and a linearly polarized light beam entering said electro-optical material at an incident angle $\psi$ of said light beam so that the speed component $V \cos \psi$ of said light beam in said electro-optical material, taken along said longitudinal axis of said strip line, is equal to said predetermined speed of said voltage pulse.

2. The voltage detecting device of claim 1, wherein said strip line is made of transparent conductive material.

3. The voltage detecting device of claim 1, wherein said electrode is made of transparent conductive material.

4. The voltage detecting device of claim 1, wherein both said strip line and said electrode are made of transparent conductive material so that a linearly polarized light beam is allowed to enter said electro-optical material through one of said strip line and said electrode and to emerge from said electro-optical material through the other of said strip line and said electrode.

5. The voltage detecting device of claim 1, in which said electrode is made of metal, the end portions of said strip line are made of transparent conductive material, and the remaining portion of said strip line is made of reflecting conductive material so that a linearly polarized light beam incident to said reflecting conductive material is reflected a plurality of times in said electro-optical material.

6. The voltage detecting device of claim 1, wherein said strip line is made of metal, and the end portions of said electrode are made of transparent conductive material, and the remaining portion of the electrode is made of reflecting conductive material so that a linearly polarized light beam incident to said reflecting conductive material at one end portion of said electrode is reflected a plurality of times in said electro-optical material and emerges from the other end portion of said electrode.

7. The voltage detecting device of claim 1, wherein said electro-optical material is cut so that the change in polarization of said light beam is maximized by said voltage at said predetermined part of said object under measurement.

* * * * *